(12) United States Patent
Schloesser

(10) Patent No.: US 7,471,547 B2
(45) Date of Patent: Dec. 30, 2008

(54) MEMORY CELL ARRAY

(75) Inventor: Till Schloesser, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/945,437

(22) Filed: Nov. 27, 2007

(65) Prior Publication Data

US 2008/0089114 A1 Apr. 17, 2008

Related U.S. Application Data

(63) Continuation of application No. 11/562,315, filed on Nov. 21, 2006, now Pat. No. 7,301,799, which is a continuation of application No. 11/004,881, filed on Dec. 7, 2004, now Pat. No. 7,139,184.

(51) Int. Cl.
*G11C 11/00* (2006.01)
(52) U.S. Cl. .................. 365/154; 365/149; 365/150
(58) Field of Classification Search ........... 365/154, 365/149, 150
See application file for complete search history.

(56) References Cited

U.S. PATENT DOCUMENTS

| | | | |
|---|---|---|---|
| 5,502,320 A | 3/1996 | Yamada | |
| 6,035,355 A | 3/2000 | Kelley et al. | |
| 6,274,453 B1 | 8/2001 | Schlosser et al. | |
| 6,410,948 B1 | 6/2002 | Tran et al. | |
| 6,419,948 B2 | 7/2002 | Blume et al. | |
| 6,545,904 B2 | 4/2003 | Tran | |
| 6,735,132 B2 | 5/2004 | Siek | |
| 6,785,157 B2 | 8/2004 | Arimoto et al. | |
| 6,867,994 B2 | 3/2005 | Tsukikawa | |
| 6,894,915 B2 | 5/2005 | Tran | |
| 7,020,039 B2 | 3/2006 | Tran | |
| 7,035,128 B2* | 4/2006 | Yamasaki et al. | 365/59 |
| 2004/0173838 A1* | 9/2004 | Ichise et al. | 257/309 |
| 2004/0184298 A1 | 9/2004 | Takahashi et al. | |

FOREIGN PATENT DOCUMENTS

| | | |
|---|---|---|
| KR | 1019950003402 B1 | 4/1995 |
| TW | 200425154 | 11/2004 |
| WO | 01011489 A1 | 1/2001 |

* cited by examiner

*Primary Examiner*—Pho M. Luu
(74) *Attorney, Agent, or Firm*—Edell, Shapiro & Finnan, LLC

(57) ABSTRACT

A memory cell array includes memory cells, bit lines running along a first direction, word lines running along a second direction perpendicular to the first direction, and continuous active area lines, wherein transistors are at least partially formed in the active area lines. The transistors electrically couple corresponding memory cells to corresponding bit lines via bit line contacts, and the transistors are addressed by the word lines. The bit line contacts are formed in a region generally defined by an intersection of a bit line and a corresponding active area line. Neighboring bit line contacts which are connected with one active area line are connected with neighboring bit lines. Consequently, one active area line is crossed by a plurality of bit lines.

25 Claims, 5 Drawing Sheets

MEMORY CELL ARRAY

CROSS REFERENCE TO RELATED APPLICATIONS

This application is a continuation of U.S. patent application Ser. No. 11/562,315, filed Nov. 21, 2006, and titled "Memory Cell Array," which is a continuation of U.S. patent application Ser. No. 11/004,881, filed Dec. 7, 2004, and titled "Memory Cell Array," the entire contents of which are hereby incorporated by reference.

BACKGROUND

Memory cells of a dynamic random access memory (DRAM) generally comprise a storage capacitor for storing an electrical charge which represents information to be stored, and an access transistor connected to the storage capacitor. The access transistor comprises first and a second source/drain regions, a channel connecting the first and second source/drain regions, and a gate electrode controlling an electrical current flowing between the first and second source/drain regions. The transistor usually is at least partially formed in a semiconductor substrate. The portion in which the transistor is formed generally is denoted as the active area. The gate electrode forms part of a word line, and the gate electrode is electrically isolated from the channel by a gate dielectric. By addressing the access transistor via the corresponding word line, the information stored in the storage capacitor is read out. In particular, the information is read out to a corresponding bit line via a bit line contact.

In currently-used DRAM memory cells, the storage capacitor can be implemented as a trench capacitor in which the two capacitor electrodes are disposed in a trench which extends into the substrate in a direction perpendicular to the substrate surface. According to another implementation of a DRAM memory cell, the electrical charge is stored in a stacked capacitor, which is formed above the surface of the substrate.

Generally, a DRAM memory cell array having a higher packaging density is desirable. For example U.S. Pat. No. 6,419,948, the disclosure of which is incorporated herein by reference in its entirety, discloses a memory cell array in which the active area is formed as a continuous line. The active area line and the bit line are formed as waving lines, so that one bit line and one corresponding active area line intersect at many points. According to this layout, the memory cells can have an area of about 6 $F^2$, wherein F denotes the minimum pitch according to the technology used.

In addition, U.S. Pat. No. 6,545,904, the disclosure of which is incorporated herein by reference in its entirety, discloses a memory cell including an access transistor and a storage capacitor which can be formed so as to implement a 6 $F^2$ (6F*F) DRAM array. In particular, two neighboring access transistors are arranged, so that they have one common bit line contact. In addition, neighboring access transistors formed on a single active area line are electrically isolated from each other by an isolation gate line.

DE 199 28 781 C1 discloses a 6 $F^2$ memory cell in which two adjacent memory cells share one common bit line contact. Two neighboring pairs of memory cells which are assigned to one active area line are separated and electrically isolated from each other by a groove which is filled with an isolating material.

Furthermore, U.S. Pat. No. 5,502,320, the disclosure of which is incorporated herein by reference in its entirety, discloses a memory cell array in which transistors are formed in continuous active area lines. The active area lines are arranged in parallel with the bit lines. Two adjacent pairs of neighboring memory cells are separated and isolated from each other by applying an appropriate voltage to isolation gate lines which are arranged between the two adjacent pairs of memory cells. The word lines and the isolation gate lines are implemented as buried word lines and buried isolation gate lines, respectively.

SUMMARY

In accordance with the present invention, a memory cell array is formed by providing a plurality of memory cells along a substrate, where each of the memory cells includes a storage element and an access transistor. A plurality of bit lines are formed that extend along a first direction of the substrate. A plurality of active area lines and a plurality of isolation trenches are also formed in the semiconductor substrate, with the isolation trenches being adjacent the active area lines such that each isolation trench is disposed between and electrically isolates a first active area line from a second active area line. The access transistors are at least partially formed in the active area lines and electrically couple corresponding storage elements to corresponding bit lines via bit line contacts, and at least a portion of each bit line contact is located at an intersection of a bit line and a corresponding active area line.

A method of forming bit line contacts in a substrate is also provided in accordance with the invention, where the method comprises forming a plurality of bit lines that extend along a first direction of the substrate, and forming a plurality of active area lines in the substrate. A plurality of bit line contacts are formed along each active area line, and at least a portion of each bit line contact is located at an intersection of a bit line and an active area line.

BRIEF DESCRIPTION OF THE DRAWINGS

The features and advantages of the invention will become more readily apparent from a consideration of the following detailed description said forth with reference to the accompanying drawings which specify and show preferred embodiments of the invention, wherein like elements are designed by identical references throughout the drawings; and in which.

DETAILED DESCRIPTION

Figure 1:
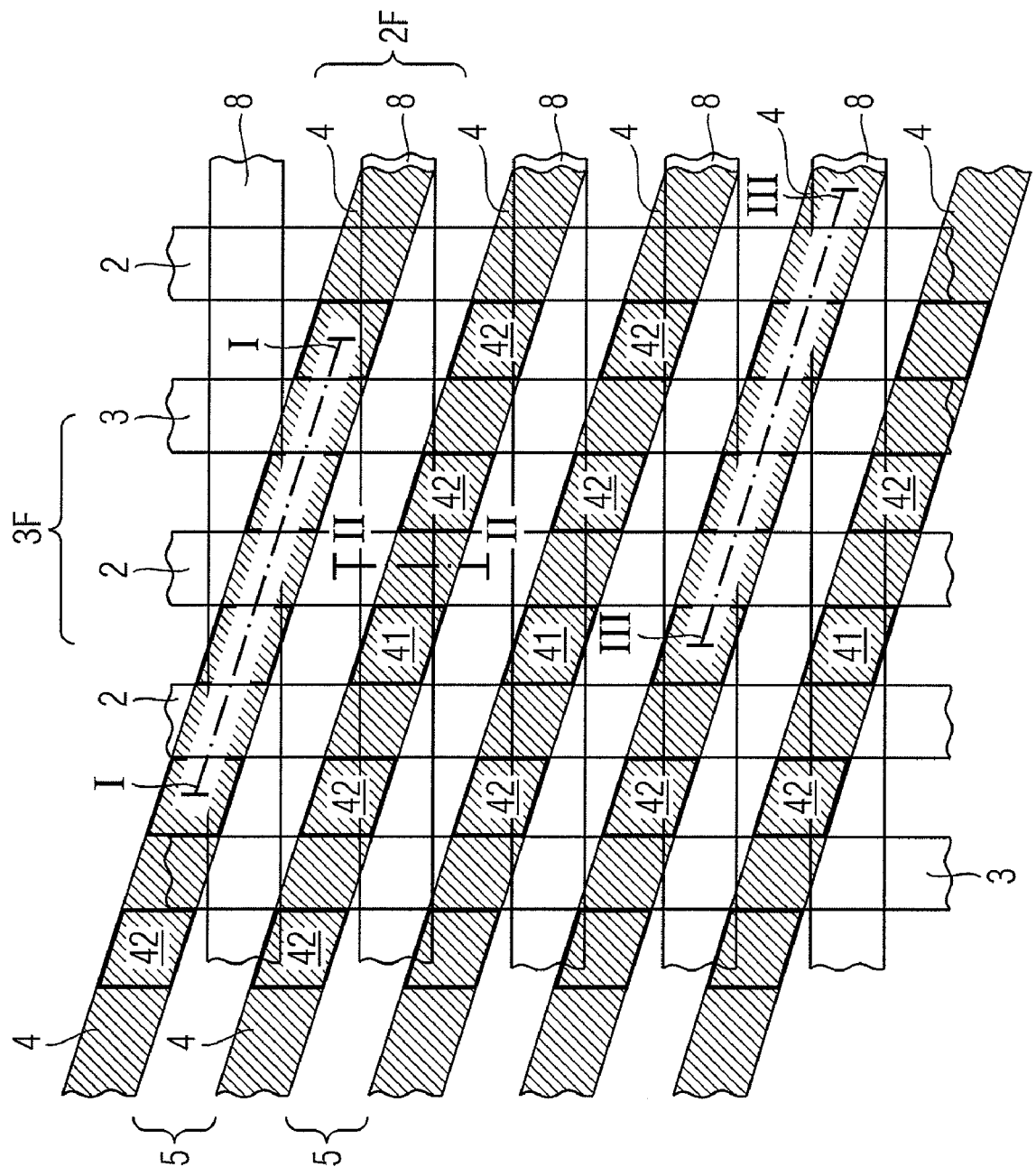
FIG. 1 shows a first preferred embodiment of the present invention.

The present invention provides a memory cell array in which the transistors of the memory cells are formed in continuous active area lines. The active area lines are formed so that they extend continuously from one edge of the memory cell array to another edge of the memory cell array. Neighboring or first and second active area lines are separated and electrically isolated from each other by isolation trenches which are filled with an isolating material such as silicon dioxide. Accordingly, a plurality of transistors is formed in one continuous active area line. This is in contrast to known memory cell arrays in which the active area line is divided into segments which are electrically isolated from each other by an isolating material and in which each of the segments comprises one or two transistors.

The methods of the present invention are advantageous with respect to known memory cell arrays since it is much easier to lithographically define active area lines instead of segments of active areas.

According to the present invention, when being regarded in a three-dimensional cross-section, the bit lines are arranged in a plane which lies above the active areas. Nevertheless, when being regarded in a two-dimensional plan view, each of the active area lines is arranged in such a manner that it intersects a plurality of bit lines. A bit line contact is formed at an intersection of a bit line and a corresponding active area, and the active area line is arranged in such a manner that neighboring bit line contacts, which are associated to one active area line, are connected with neighboring bit lines. In particular, if the first bit line contact which is associated with a first active area line, is connected with the first bit line, then the second bit line contact of the first active area line is connected with the second bit line, the third bit line contact of the first active area line is connected with the third bit line, and so on.

According to the present invention, the active area lines can be formed as straight lines. Nevertheless, it is also possible that the active area lines are formed as angled lines having different angles with respect to the bit lines, for example. To be more specific, the active area lines can be formed in parallel with the bit lines at predetermined portions of the active area lines and they can have a certain angle with respect to the bit lines at other portions of the active area lines. Alternatively, the active area lines can have a first angle with respect to the bit lines at first portions of the active area lines, and they can have a second angle with respect to the bit lines at second portions of the active area lines.

Nevertheless, it is especially preferred to form the active area lines as straight lines. In this case, they can be lithographically defined more easily.

On the other hand, if the active area lines are implemented as angled lines, a contact area of the bit line contacts can be enlarged whereby a contact resistance is reduced.

According to the present invention, the memory cells can be implemented as DRAM memory cells comprising a storage capacitor and an access transistor. In particular, the storage capacitor can be a trench capacitor or a stacked capacitor which is disposed above the substrate surface.

The present invention is highly advantageous for memory cells comprising a stacked capacitor since in this case the contact plugs for connecting the transistor with the corresponding storage capacitor can be defined very easily.

Nevertheless, the present invention can be equally applied to different types of memory cells such as generally known in the art, such as MRAM ("magnetic random access memories"), FeRAM ("ferroelectric random access memories"), PCRAM ("phase changing random access memories") in which the storage element is implemented in a different manner.

According to a preferred embodiment to a present invention, an angle between the active area lines and the bit lines amounts to 10 to 60°. If the active area lines are not implemented as straight lines, this angle is measured between a straight line connecting the starting point and the end point of the active area lines and the bit lines. An angle from 10 to 25° is especially preferred.

According to a further preferred embodiment of the present invention, one bit line contact is associated to two neighboring transistors of one active area line. In this case, the memory cell array can be implemented in a very dense manner. In this case, it is especially preferred, that the angle between the active area lines and the bit lines amounts to approximately 18°, in particular, 18.43°.

According to a further preferred embodiment of the present invention, part of the word lines act as isolation gate lines which are adapted to isolate neighboring transistors from each other. In particular, it is especially preferred that every third word line acts as such an isolation gate line so that pairs of adjacent memory cells are isolated from each other.

By applying an appropriate voltage to the isolation gate lines, a current is prevented from flowing across the active area line lying beneath the isolation gate line. As a consequence, memory cells adjacent to the isolation gate line are electrically isolated from each other.

If pairs of memory cells are isolated from each other, it is especially preferred that the two memory cells belonging to one pair of memory cells share one common bit line contact.

According to the present invention, a memory cell array is further provided, the memory cell array comprising memory cells, each of said memory cells comprising a storage element and an access transistor, the memory cell array further comprising bit lines running along a first direction, the bit lines being formed as straight bit lines, a semiconductor substrate, continuous active area lines and isolation trenches being formed in said semiconductor substrate, the isolation trenches being adjacent to the active area lines, and the isolation trenches being adapted to electrically isolate neighboring active area lines from each other, the access transistors being at least partially formed in the active area lines and electrically coupling corresponding storage elements to corresponding bit lines via bit line contacts, the transistors being addressed by the word lines, the bit line contacts being formed in a region generally defined by an intersection of a bit line and a corresponding active area line, wherein neighboring bit line contacts, each of which is connected with one active area line, are connected with neighboring bit lines.

Accordingly, the present invention provides a memory cell in which the bit lines are formed as straight lines. In addition, the continuous active area lines are formed so as to intersect a plurality of bit lines forming a bit line contact at an intersection of a bit line and a corresponding active area line. According to the present invention, neighboring bit line contacts which are associated with one active area line are connected with neighboring bit lines. Differently stated, if the first bit line contact which is associated with a first active area line is connected with the first bit line, then the second bit line contact of the first active area line is connected with the second bit line, the third bit line contact of the first active area line is connected with the third bit line, and so on.

The memory cell array of the present invention preferably further comprises a plurality of word lines wherein the transistors are addressed by these word lines.

According to a preferred embodiment to a present invention, an angle between the active area lines and the bit lines amounts to 10 to 60°. If the active area lines are not implemented as straight lines, this angle is measured between a straight line connecting the starting point and the end point of the active area lines and the bit lines. An angle from 10 to 25° is especially preferred.

According to a further preferred embodiment of the present invention, one bit line contact is associated to two neighboring transistors of one active area line. In this case, the memory cell array can be implemented in a very dense manner. In this case, it is especially preferred, that the angle between the active area lines and the bit lines amounts to approximately 18°, in particular, 18.43°.

FIG. 1 shows a first embodiment of the memory cell array of the present invention. In FIG. 1, a plurality of bit lines 8 are formed along a horizontal direction, whereas a plurality of word lines 2 are arranged in a second direction which is preferably perpendicular to the first direction. In addition, continuous active area lines 4 are disposed at a slanted angle with respect to the bit lines and the word lines, respectively. As is shown in FIG. 1, the bit lines 8 as well as the word lines 2 are implemented as straight lines.

Usually, the active area lines are defined by forming isolation trenches 5 which are filled with an isolating material, in a semiconductor substrate such as a silicon substrate. Accordingly, the active area lines 4 are separated and electrically isolated from each other. At an intersection of an active area line 4 and a bit line 8, a bit line contact 41 is formed. Moreover, node contacts 42 are formed at those portions of the active area lines which are not covered by a bit line 8 nor by a word line 3. The node contact provides an electrical contact between an access transistor and a corresponding storage capacitor. Usually, the storage capacitor is formed on top of the shown semiconductor surface.

As is shown in FIG. 1, an isolation gate line 3 is disposed between pairs of neighboring word lines 2. In a cross-section taken along I-I, the word lines 2 and the isolation gate lines 3 are disposed above the active area lines 4. Transistors are formed in the active area lines 4, wherein the transistors comprise a first source/drain region, a second source/drain region as well as a channel connecting first and second source/drain regions. The conductivity of the channel between the first and the second source/drain regions is controlled by the word lines 2 and the isolation gate line 3. In particular, an appropriate voltage is applied to the isolation gate line 3, so that no current flows beneath the isolation gate line. Accordingly, an electrical isolation between neighboring pairs of memory cells is achieved by the isolation gate line. The first and the second drain regions are arranged beneath the bit line contact 41 and the node contact 42, respectively.

As is shown in FIG. 1, the word lines 2, the isolation gate lines 3 and the bit lines 8 are arranged in a regular manner so as to form a grid.

In the arrangement shown in FIG. 1, two adjacent transistors share a common bit line contact 41, as will also be explained later.

The size of a single memory cell is typically described in terms of its minimal feature size (F). Usually, it is intended to implement the conductive lines so that they have a width equal to the minimal feature size and that they have a distance from each other which is equal to the minimal feature size. Accordingly, the sum of the isolation space between the conductive lines and the width of the conductive lines corresponds to the double of the feature size of the memory device. Currently, the feature size amounts to about 100 nm, a reduction of this feature size being aimed at. In particular, future memory devices will have feature sizes of 50 nm and below.

In the memory cell array in FIG. 1, the width of each cell along the word line direction is 2 F, whereas the width along the bit line direction is 3 F. This results in a cell size of 6 F$^2$ (6F*F).

As can be seen from FIG. 1, since two node contacts 42 are followed by one bit line contact 41 and two neighboring bit line contacts of one active area line 4 are assigned to two different bit lines 8, a horizontal distance of neighboring bit line contacts preferably amounts to 6 F, whereas a vertical distance of neighboring bit line contacts preferably amounts to 2 F. As a consequence, an angle between the bit line 8 and the active area line 4 of about 18°, in particular 18.43°, is especially preferred, since 18.43° amounts to arctan(⅓).

The memory cell device of FIG. 1 can be implemented very easily, since the active area is formed as a straight line. Accordingly, it can be lithographically defined in a simple manner, because only masks having a stripe pattern need to be used. To be more specific, in this case, the masks have a pattern of lines and spaces. In addition, since the bit line contact 41 is formed at an angled intersection between the active area line and the bit line, the contact area can be increased, whereby a contact resistance is decreased.

Figure 2:
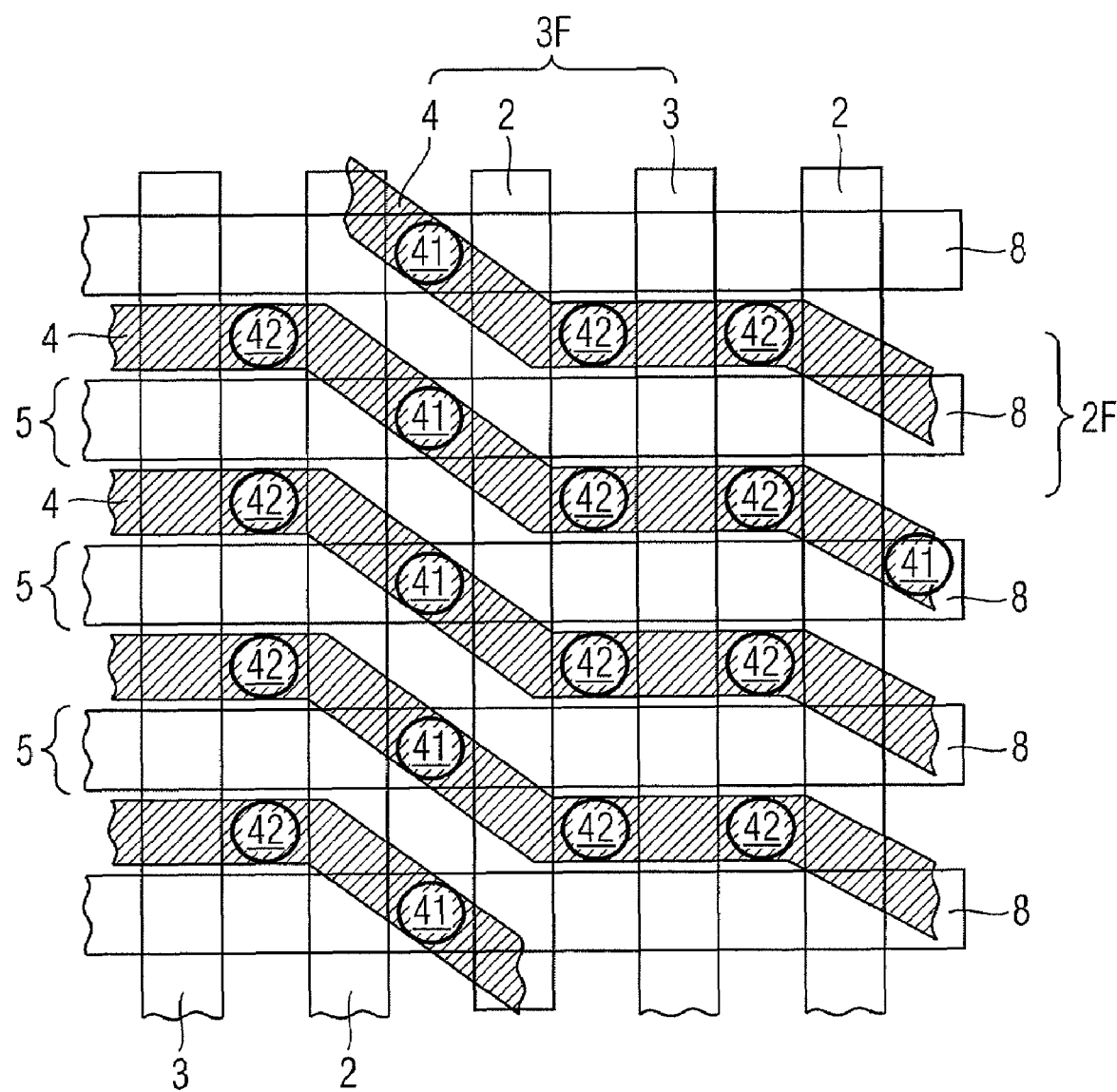
FIG. 2 shows a second preferred embodiment of the present invention.

FIG. 2 shows a second embodiment of the memory cell array of the present invention. The arrangement of the word lines 2, isolation gate lines 3 and bit lines 8 in FIG. 2 is the same as that in FIG. 1. In addition, the function of the isolation gate lines 3 is the same as in FIG. 1. Accordingly, a description thereof is omitted. As can be seen from FIG. 2, the continuous active area lines are not formed as straight lines but as angled lines. In particular, each of the continuous active area lines, which are generally formed in parallel to each other, comprises horizontal portions as well as slanted portions. As a modification, the active area lines could as well comprise only slanted portions having, for example, two different angles with respect to the bit lines 8.

As is shown in FIG. 2, the portions of the active area lines lying in the portion between two neighboring bit lines 8 are arranged horizontally whereas the portions of the active area lines, which are crossed by the bit lines 8, intersect the bit lines in an angled manner. According to a modification, the portions of the active area lines lying in the spaces between adjacent bit lines could have a smaller angle with respect to the bit lines whereas the portions of the active area lines which are crossed by the bit lines, could have a larger angle with respect to the bit lines 8.

In the memory all array of FIG. 2, the contact area of the bit line contacts, which are formed at an intersection of the active area lines and the bit lines, can be made larger whereby the contact resistance is decreased. In addition, the node contacts 42 are placed in the spaces between neighboring bit lines so that a contact to the second source/drain regions of the transistors can be easily achieved.

As can be seen from FIG. 2, the memory cell size amounts to 6 F$^2$ as is also the case in FIG. 1.

Figure 3:
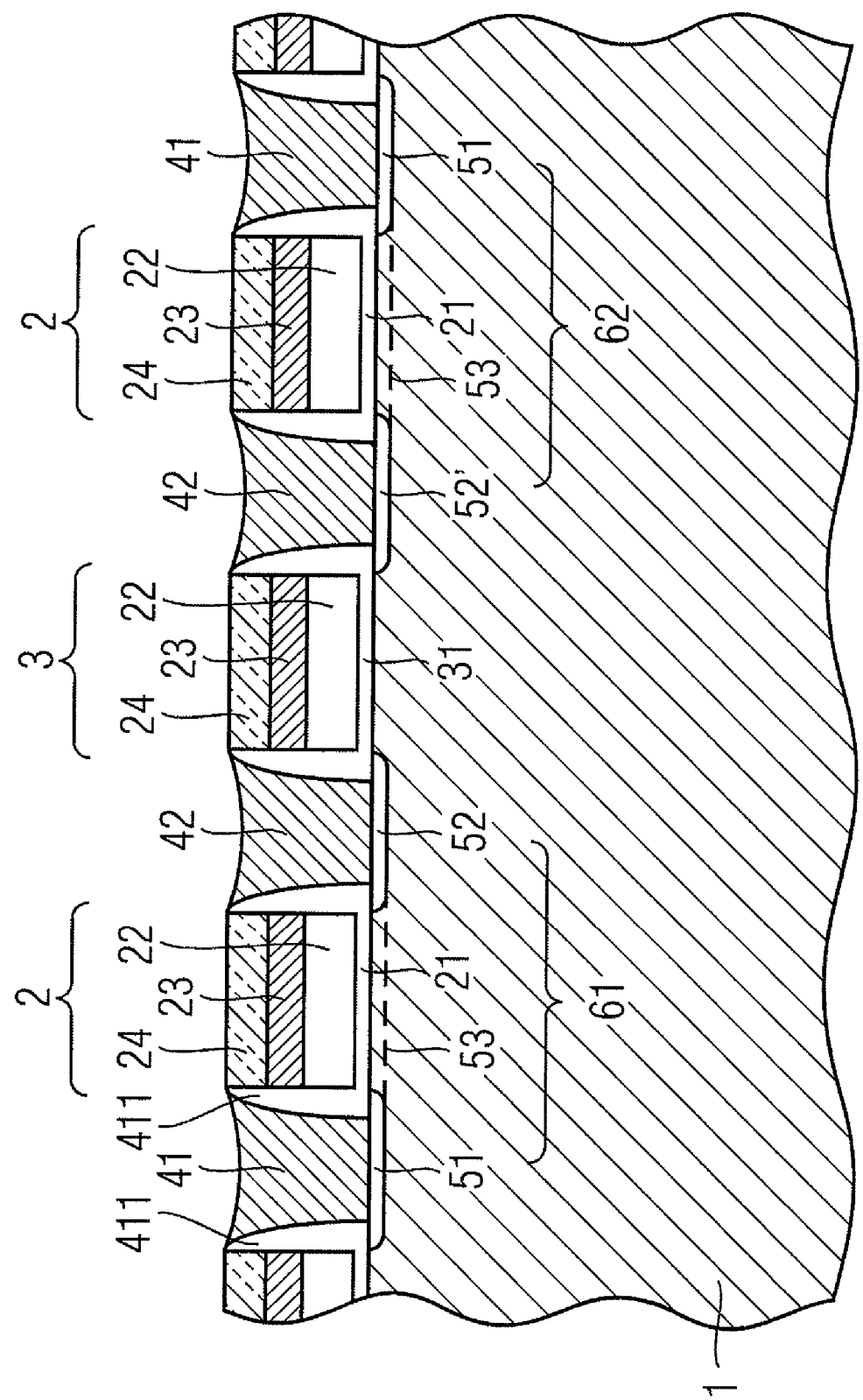
FIG. 3 shows a cross-section of a memory cell array according to a first preferred implementation of the individual memory cells.

FIG. 3 shows an embodiment of the invention by means of a cross-section of the memory cell array of FIG. 1 between points III and III in FIG. 1 according to a first implementation of the memory cell, which is for example known from U.S. Pat. No. 6,545,904.

In a semiconductor substrate 1, first and second access transistors 61, 62 are formed. The first access transistor 61 comprises a first source/drain region 51 and a second source/drain region 52. The first and the second source/drain regions are implemented as n-doped portions. The channel or channel region is formed in the p-doped substrate portion between the first and the second source/drain regions 51, 52 and the conductivity of the channel is controlled by the word line 2. The word lines 2 are isolated from the channel by a gate dielectric 21.

As is shown in FIG. 3, the word line can be formed of a polysilicon layer 22, a layer 23 having a high conductivity such as a metallic layer, and an isolating layer 24. The word line 2 is electrically isolated from the adjacent bit line contact 41 and the adjacent node contact 42 by a spacer 411 made of an isolating material. The node contact 42 is provided so as to accomplish an electrical contact between the second source/drain region 52 and a storage electrode of a storage capacitor (not shown). The bit line contact 41 is associated with two neighboring transistors. The second access transistor 62 likewise comprises first and second source/drain regions 51, 52', a gate electrode 2 for controlling an electrical current flowing between the first and second source/drain regions, a bit line contact 41 which also serves as a bit line contact of the access transistor disposed on the right side of the shown access transistor 62 as well as a node contact 42 for electrically connecting the second source/drain region 52' with the storage electrode of a storage capacitor (not shown). An isolation gate line 3 is disposed between the first and the second access transistors 61, 62. An appropriate voltage is applied to the isolation gate line 3, so as to prevent an electrical current from flowing between the second source/drain regions 52, 52'. The isolation gate line likewise comprises a polysilicon layer 22, a highly conductive layer 23 and an isolating layer 24. The isolation gate line 3 is isolated from the substrate by a gate dielectric 31.

By applying an appropriate voltage to the gate electrode 2 the access transistor 61 or 62 is addressed or activated, so that a current flows between the first and the second source/drain regions 51, 52. Thereby, the electrical charge stored in the storage capacitor (not shown), which is electrically connected with the node contact 42, can be read out and transferred to a bit line via the bit line contact 41.

Figure 4:
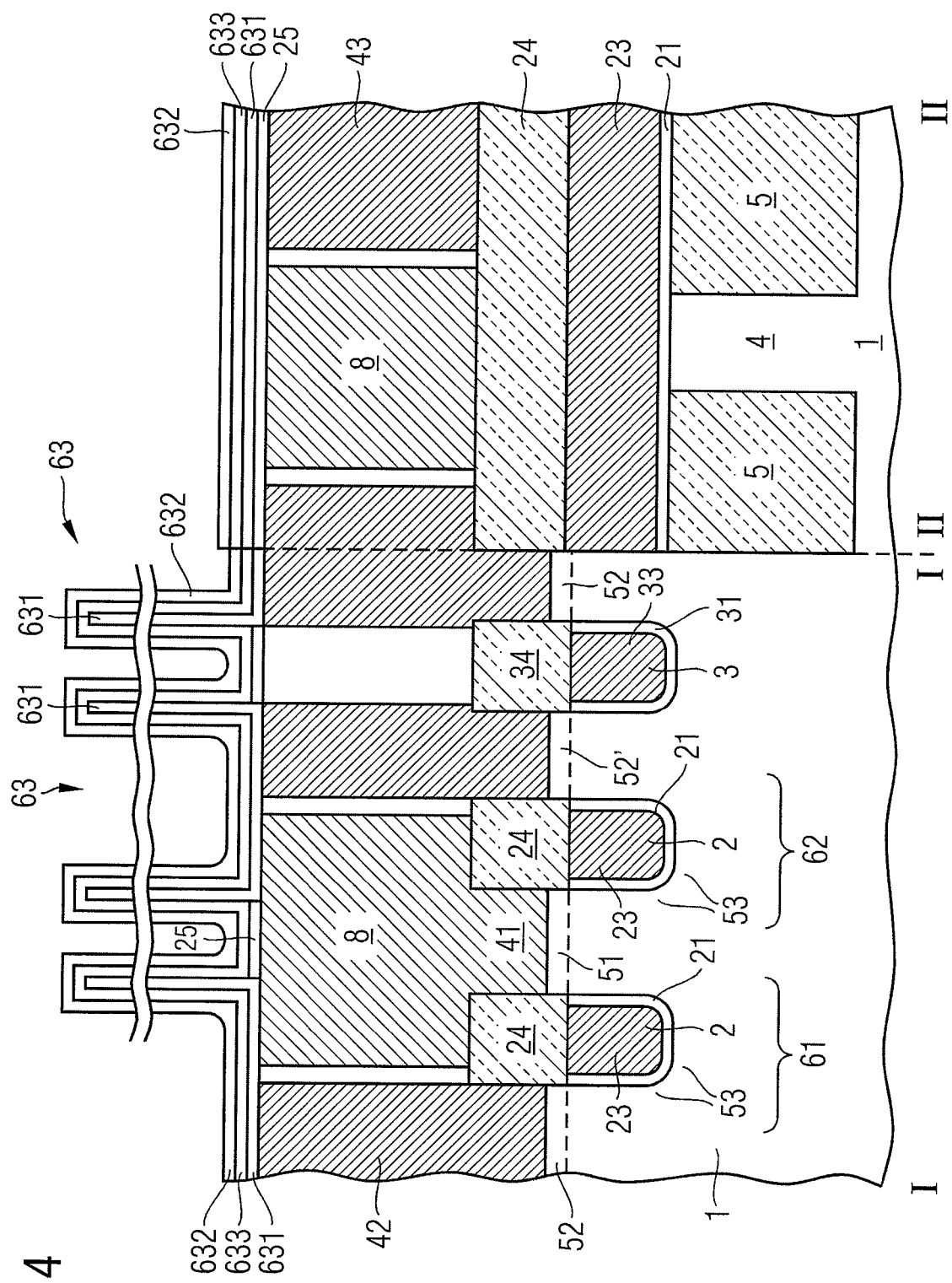
FIG. 4 shows a cross-section of a memory cell array according to a second preferred implementation of the individual memory cells.

FIG. 4 shows a further embodiment of the present invention, in which the single memory cells are implemented in a different manner. The left part of FIG. 4 shows a cross-section between I and I in FIG. 1, whereas the right part of FIG. 4 shows a cross-section between II and II in FIG. 1. As is shown in FIG. 4, the word lines 2 and the isolation gate lines 3 are implemented as buried word lines and buried isolation gate lines, respectively. In other words, the top surface of the word lines 2 and the top surface of the isolation gate lines 3 are disposed beneath the surface of the semiconductor substrate.

In FIG. 4, the first access transistor 61 comprises a first source/drain region 51 and a second source/drain region 52, which are both implemented as n-doped portions. The channel 53 or channel region is formed in the p-doped substrate portion between the first and the second source/drain regions 51, 52 and the conductivity of the channel is controlled by applying an appropriate voltage to the word line 2. The word line 2 comprises a gate dielectric 21 for isolating the word line 2 from the channel 53 and additionally comprises a high conductivity layer 23 such as a metallic layer. An insulating layer 24 is disposed above the high conductivity layer 23 so as to electrically isolate the word line from the first and second source/drain regions 51, 52. The access transistor 62 comprises a first and a second source/drain regions 51, 52', as well as a channel 53 in the p-doped substrate portion between the first and the second source/drain regions. The conductivity of the channel 53 is controlled by the word line 2 having an identical construction to the word line of the first access transistor.

Since the word lines 2 are formed as buried word lines, the channel 53 is formed in the shape of a "U", whereby a channel length is increased.

On the right side of the second source/drain region 52' an isolation gate line 3 is disposed. The isolation gate line 3 comprises a gate dielectric 31 as well as a high conductivity layer 33. An insulating layer 34 is disposed above the high conductivity layer 33 so as to accomplish an electric isolation from the adjacent source/drain regions. An appropriate voltage is usually applied to the isolation gate line 3 so as to prevent an electrical current from flowing between the second source/drain region 52', and the second source/drain region 52 of the access transistor disposed on the right hand side of the second access transistor 62.

In a similar manner as in FIG. 3 a node contact 42 connects the second source/drain regions 52, 52' with the storage electrode of a storage capacitor 63. As can be seen from FIG. 4, the storage capacitor is implemented as a stacked capacitor comprising a first storage electrode 631, which is connected with the node contact 42, a second storage electrode 632, and a capacitor dielectric 633 which is disposed between the first and second storage electrodes 631, 632, and electrically isolates the two storage electrodes from each other.

The two access transistors 61, 62 have a common bit line contact 41. The bit line contact 41 may be formed of doped polysilicon or another conducting material. The bit line 8 which extends in a direction oblique to the plane of the drawing, is disposed above the bit line contact. The bit line 8 can be made of an arbitrary conducting material. In particular, the bit line 8 can be made of a layer stack which is similar or identical to a commonly used gate stack. For example, the bit line 8 including the bit line contact 41 can be made of a layer stack comprising a polysilicon layer, a highly conductive layer as well as an isolating layer so that it is formed in a similar manner as the word lines 2 which are shown in FIG. 3. In this case, it is especially preferred that the gate electrodes of the transistors formed in a peripheral portion of the memory device are made of the same layer stack as the bit lines including the bit line contacts formed in the memory cell array.

The right hand part of FIG. 4 shows a cross-section of the memory cell array of FIG. 1 between II and II. As can be seen from FIG. 4, the active area line 4 is defined by two adjacent isolation trenches 5 which are filled with an isolating material such as $SiO_2$. A word line comprising a gate dielectric 21, a high conductivity layer 23 as well as an insulating layer 24 is formed above the active area line and the adjacent isolation trenches 5. Above the insulating layer 24, a bit line 8 is formed.

On the left hand side of FIG. 4, an isolation groove 44 is formed above the isolation gate line 3, so as to electrically isolate adjacent pairs of memory cells from each other. When the access transistor 61 is addressed by the word line 2, an electrical charge stored as an information in the storage transistor 63 is read out via the node contact 42 and transferred across the access transistor 61 from the second source/drain region 52 to the first source/drain region 51 and transferred to the bit line 8 via the bit line contact 41.

As is to noted from the left hand part of FIGS. 3 and 4 in conjunction with FIG. 1, the word lines 2, the isolation gate lines 3 as well as the bit lines 8 extend in directions which are oblique with respect to the plane of the drawing.

As will be apparent to the person skilled in the art, the memory cell array of the present invention can be applied to a plurality of different implementations of the individual memory cells.

Figure 5:
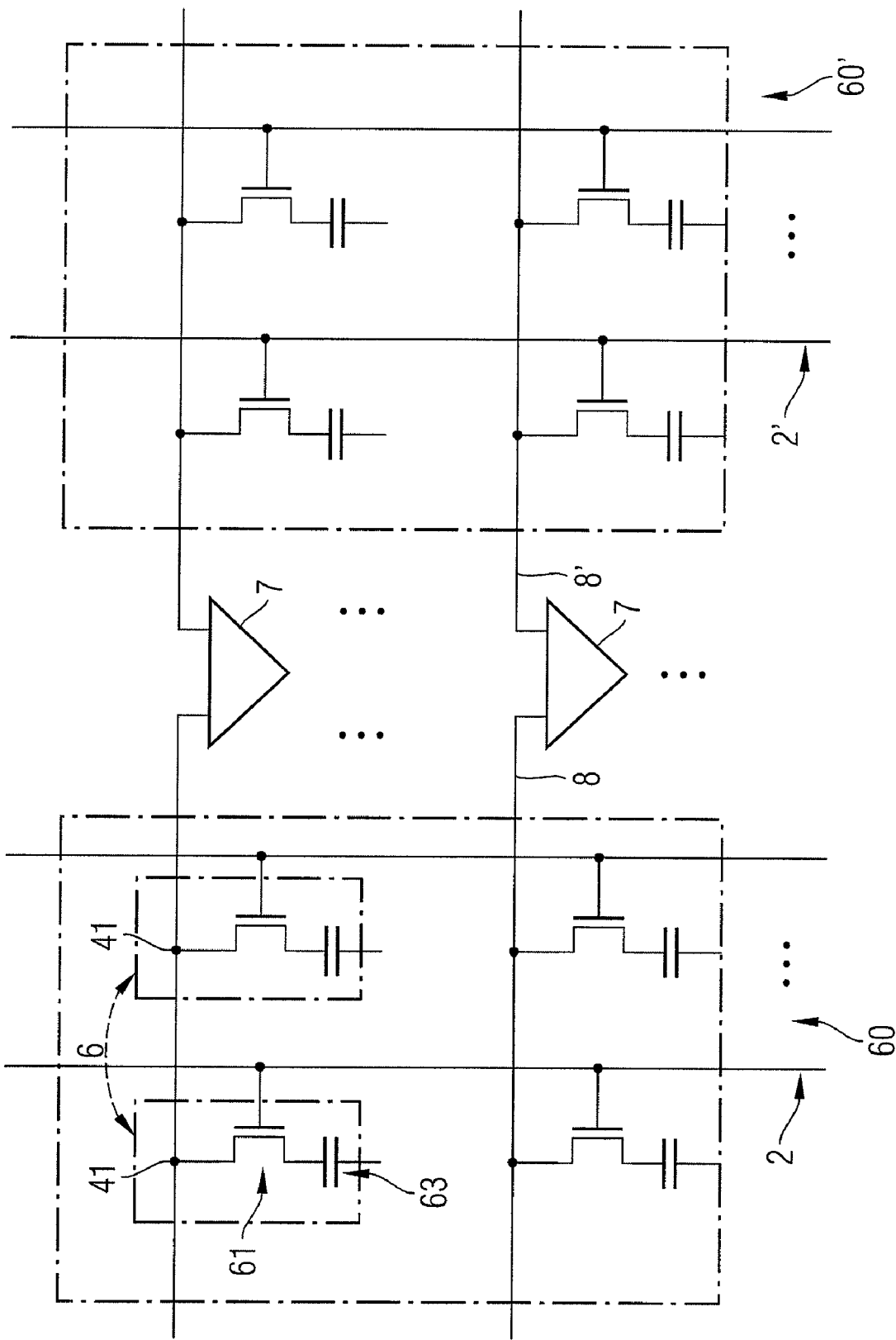
FIG. 5 shows a schematic circuit representing a memory cell array of the present invention.

FIG. 5 is a simplified schematic diagram describing a pair of memory cell arrays 60, 60' in accordance with the present invention. The arrays are implemented in an open bit line configuration, each employing memory cells 6 formed from one transistor 61 and one capacitor 63.

The memory arrays 60, 60' are each coupled to respective groups of bit lines 8, 8' and respective groups of word lines 2, 2'. The two groups of bit lines 8, 8' are coupled, one from each of the memory arrays 60, 60', to sense amplifiers 7. The sense amplifiers 7 comprise peripheral circuitry, i.e., circuitry employed in support of the memory arrays 60, 60' and generally are formed outside of peripheries of the memory arrays 60, 60'.

In operation, one memory cell 6 is selected, for example, by activating one word line 2. The word line 2 is coupled to a respective gate electrode of a respective one of the transistors 61. The bit line 8 is coupled to the first source/drain region of one of these transistors 61 via the bit line contact 41. The transistor 61 is then turned on, coupling charge stored in the capacitor 63 to the associated bit line 8. The sense amplifier 7 then senses the charge coupled from the capacitor 63 to the bit line 8. The sense amplifier 7 compares that signal to a reference signal such as the reference charge Qref or a reference signal which is obtained by sensing a corresponding bit line 8', without a voltage being applied to the corresponding word line 8', amplifies the resulting signal and latches the amplified signal from appropriate duration. This allows data represented by the charge stored in the capacitor 63 to be accessed external to the memory arrays 60, 60' and also allows the capacitor 63 to store charge representative of the data from the memory cell 6 back into the memory cell 6. As is obvious to the person skilled in the art, an alternative array architecture such as a vertically twisted bit line array architecture, which is generally known, can be used as well.

What is claimed is:

1. An integrated circuit including a memory cell array comprising: memory cells, each of the memory cells comprising a storage element and an access transistor; bit lines running along a first direction;
   word lines running along a second direction that is transverse the first direction; and
   active areas being aligned along straight lines, the access transistors being at least partially formed in the active areas and electrically coupling corresponding storage elements to corresponding bit lines via bit line contacts, the transistors being addressed by the word lines; wherein the bit line contacts are formed in a region generally defined by an intersection of a bit line and a corresponding active area line; and
   wherein neighboring bit line contacts, each of which is connected to one of the straight lines, are connected with neighboring bit lines and wherein each of the memory cells is coupled to one bit line.

2. The integrated circuit according to claim 1, wherein the active areas comprise continuous active area lines.

3. The integrated circuit according to claim 2, further comprising isolation gate lines that are configured to isolate neighboring transistors from each other, the isolation gate lines being arranged in parallel with the word lines.

4. The integrated circuit according to claim 3, wherein two word lines are followed by one isolation gate line, and one isolation gate line is followed by two word lines.

5. The integrated circuit according claim 1, wherein each of the storage elements comprises a storage capacitor.

6. The integrated circuit according to claim 5, wherein the storage capacitor comprises a stacked capacitor.

7. The integrated circuit according to claim 6, wherein an angle between the active area lines and the bit lines is between approximately 10° to 25°.

8. The integrated circuit according to claim 7, wherein an angle between the active area lines and the bit lines is between approximately 18° to 19°.

9. The integrated circuit according to claim 1, wherein one bit line contact is associated with two neighboring transistors that are formed in one active area.

10. An integrated circuit including a memory cell array comprising: memory cells, each of the memory cells comprising a storage element and an access transistor;
    bit lines running along a first direction;
    word lines running along a second direction that is transverse the first direction; and
    active areas extending in a direction that is slanted with respect to the first and second directions, gate electrodes of the access transistors being disposed in gate grooves that are formed in the active areas, the access transistors electrically coupling corresponding storage elements to corresponding bit lines via bit line contacts, the transistors being addressed by the word lines;
    wherein the bit line contacts are formed in a region generally defined by an intersection of a bit line and a corresponding active area line; and
    wherein neighboring bit line contacts, that are shifted along a direction that is slanted with respect to the first and second directions, are connected with neighboring bit lines and wherein each of the memory cells is coupled to one bit line.

11. The integrated circuit according to claim 10, wherein the active areas comprise continuous lines.

12. The integrated circuit according to claim 10, wherein the continuous lines comprise straight lines.

13. The integrated circuit according to claim 10, wherein each of the storage elements comprises a storage capacitor.

14. The integrated circuit according to claim 13, wherein the storage capacitor comprises a stacked capacitor.

15. The integrated circuit according to claim 14, wherein an angle between the active area lines and the bit lines is between approximately 10° to 25°.

16. The integrated circuit according to claim 10, wherein one bit line contact is associated with two neighboring transistors that are formed in one active area.

17. The integrated circuit according to claim 10, further comprising isolation gate lines that are configured to isolate neighboring transistors from each other, the isolation gate lines being arranged in parallel with the word lines.

18. An integrated circuit including a memory cell away comprising:
    bit lines running along a first direction;
    word lines running along a second direction that is transverse the first direction, the word lines being buried in a semiconductor substrate;
    active areas being formed in the semiconductor substrate; and
    access transistors of the memory cells being at least partially formed in the active areas, the access transistors being addressed by the word lines;
    wherein the active areas extend in a direction that is slanted with respect to the first and second directions, respectively.

19. The integrated circuit according to claim 18, wherein the active areas extend along straight lines.

20. An integrated circuit comprising a transistor, the transistor comprising:
    a first and a second source/drain portions; and
    a gate electrode, the gate electrode including:
       a gate groove disposed in a semiconductor substrate at a position between the first and the second source/drain portions, and
       a conductive material disposed in the gate groove,
    wherein an insulating material is disposed in the gate groove above the conductive material, the insulating material being configured to electrically isolate the gate electrode from the first and the second source/drain portions.

21. The integrated circuit of claim 20, wherein the conductive material comprises a metal.

22. The integrated circuit of claim 20, wherein the first and the second source/drain portions are disposed adjacent to a horizontal surface of the semiconductor substrate.

23. The integrated circuit of claim 20, wherein a lower surface of the insulating material is disposed at approximately the same level as the lower boundary of the first and second source/drain portions.

24. The integrated circuit of claim 20, wherein the upper portion of the gate groove is completely filled with the insulating material.

25. The integrated circuit of claim 20, wherein an upper surface of the insulating material is disposed above a surface of the semiconductor substrate.

* * * * *

UNITED STATES PATENT AND TRADEMARK OFFICE
CERTIFICATE OF CORRECTION

PATENT NO. : 7,471,547 B2  Page 1 of 1
APPLICATION NO. : 11/945437
DATED : December 30, 2008
INVENTOR(S) : Till Schloesser It is certified that error appears in the above-identified patent and that said Letters Patent is hereby corrected as shown below:

Column 10, line 36: replace "cell away" with -- cell array --.

Signed and Sealed this

Twenty-fourth Day of February, 2009

JOHN DOLL
*Acting Director of the United States Patent and Trademark Office*